US011435298B2

(12) United States Patent
Moore et al.

(10) Patent No.: US 11,435,298 B2
(45) Date of Patent: Sep. 6, 2022

(54) CIRCUIT BOARD ANOMALY INDICATION

(71) Applicant: HEWLETT PACKARD ENTERPRISE DEVELOPMENT LP, Houston, TX (US)

(72) Inventors: David A. Moore, Tomball, TX (US); Jonathon Hughes, Houston, TX (US); Michael L. Mixon, Roseville, CA (US); Gretchen La Fontaine Otero, Aguadilla, PR (US); Niysaan E. Vlasak, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 3 days.

(21) Appl. No.: 16/937,782

(22) Filed: Jul. 24, 2020

(65) Prior Publication Data
US 2022/0026375 A1    Jan. 27, 2022

(51) Int. Cl.
*G01N 21/956*    (2006.01)
*G01N 21/95*    (2006.01)

(52) U.S. Cl.
CPC ... *G01N 21/95607* (2013.01); *G01N 21/9501* (2013.01); *G01N 2021/95638* (2013.01)

(58) Field of Classification Search
CPC ......... G01N 21/95607; G01N 21/9501; G01N 2021/95638
USPC ...................... 356/237.1–237.6, 239.1–239.8
See application file for complete search history.

(56) References Cited

U.S. PATENT DOCUMENTS

| 5,197,105 A | 3/1993 | Uemura et al. |
| 6,268,093 B1* | 7/2001 | Kenan ..................... G03F 7/701 356/237.1 |
| 2015/0359915 A1* | 12/2015 | Farren ...................... A61L 9/20 422/24 |
| 2020/0380899 A1* | 12/2020 | Wen ........................ G09G 3/006 |

FOREIGN PATENT DOCUMENTS

| GB | 2460071 A | 11/2009 |
| JP | 2000028334 A | 1/2000 |
| WO | WO-09050349 A2 | 4/2009 |

OTHER PUBLICATIONS

Xing-Fei He, "Multispectral Imaging Extends Vision Technology Capability," Feb. 2015, pp. 1-9, Photonics Spectra, Retrieved from the Internet on May 1, 2020 at URL: <photonics.com/Articles/Multispectral_Imaging_Extends_Vision_Technology/a57179>.

\* cited by examiner

*Primary Examiner* — Tri T Ton
(74) *Attorney, Agent, or Firm* — Trop, Pruner & Hu, P.C.

(57) ABSTRACT

In some examples, a system receives a first image of a circuit board produced by a first production stage, and compares the first image to a second image of the circuit board acquired at a second production stage for the circuit board. The system indicates an anomaly with the circuit board based on the comparing.

15 Claims, 4 Drawing Sheets

CIRCUIT BOARD ANOMALY INDICATION

BACKGROUND

A circuit board includes various electronic components, which can be counted on multiple surfaces of the circuit board. The circuit board can be used in a computing device, such as a computer, a smart phone, a network device, a storage node, and so forth. The circuit board can be built in a number of different production stages.

BRIEF DESCRIPTION OF THE DRAWINGS

Some implementations of the present disclosure are described with respect to the following figures.

Figure 1:
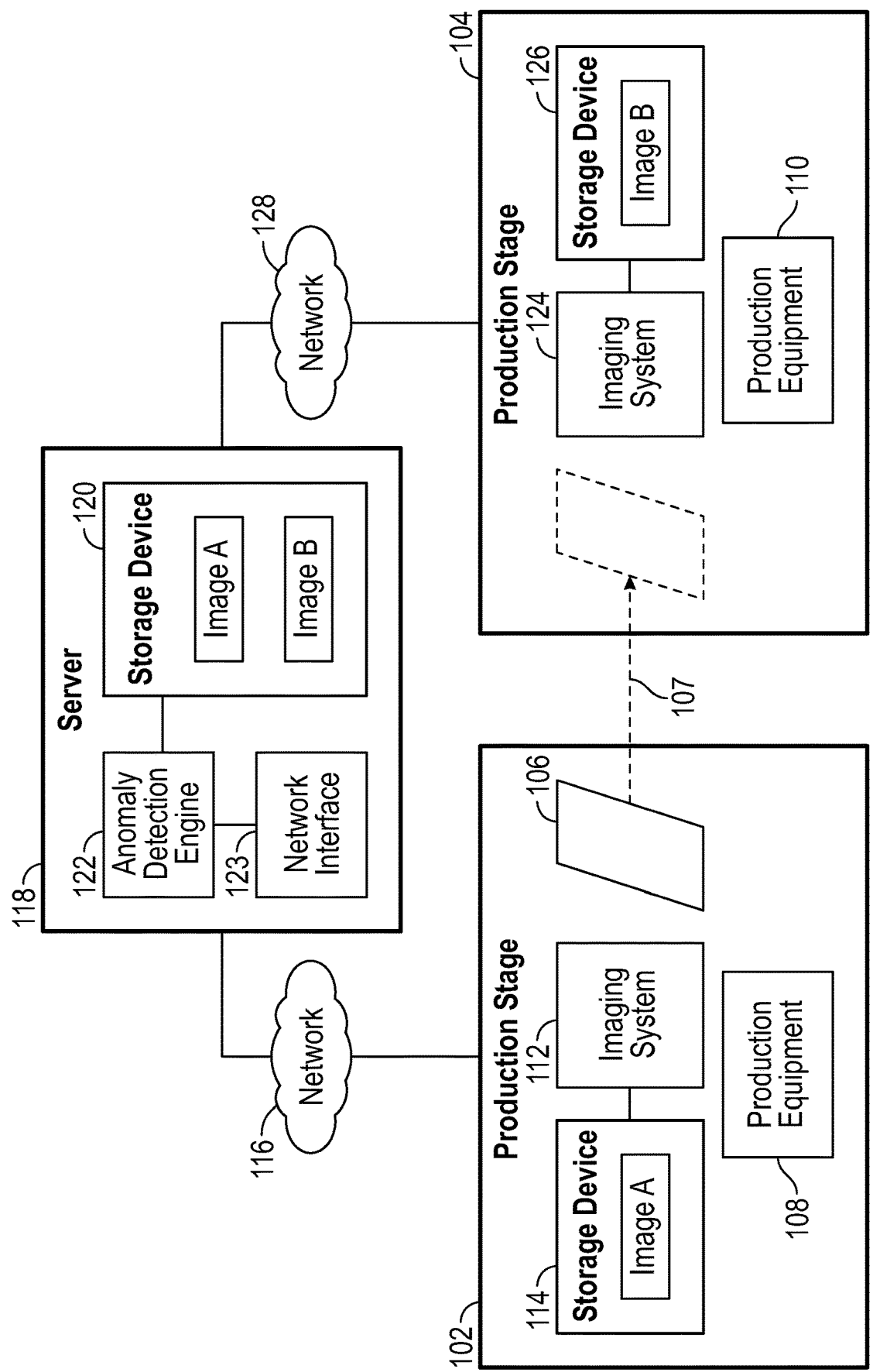
FIG. 1 is a block diagram of an arrangement that includes a server in communication with multiple production stages, according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

A "production stage" of a circuit board can refer to the stage during a manufacturing flow for adding components or layers to the circuit board or performing other manufacturing tasks with respect to the circuit board. Different production stages can apply different processes to the circuit board, where a process of the production stage refers to an activity related to manufacturing of the circuit board.

In some cases, different production stages can be located at different geographic locations, such as in different factories geographically dispersed across a city, a state, a country, or the world. In other cases, the different production stages can be located in generally the same geographic location, such as within the same factory.

After a circuit board is processed by a given production stage, the circuit board produced by the given production stage can be provided to the next production stage to apply further processing in the manufacturing flow of the circuit board. In some cases, the transport of the circuit board between different production stages may allow an opportunity for unauthorized personnel to tamper with the circuit board. Tampering can involve adding an electronic component to the circuit board, removing an electronic component from the circuit board, replacing existing electronic component on the circuit board with a different electronic component, causing damage to the circuit board, cutting an electrical trace, adding an additional electrical connection, or otherwise performing any action that is not intended to be performed as part of the manufacturing flow of the circuit board. Another example of tampering involves replacing the circuit board with another unauthorized circuit board.

The tampering of the circuit board may allow for a security breach in which the components of the circuit board may be exposed to unauthorized access, or the tampering of circuit board may cause the circuit board to not operate in an intended manner.

In other cases, the circuit board may be inadvertently altered during transport between different production stages. The inadvertent alteration of the circuit board may be due to physical damage of the circuit board during the transport, and so forth. Damage to the circuit board make cause erroneous or faulty operation of the circuit.

In some examples, detecting changes to a circuit board between production stages may be based on comparing an image of the circuit board to a "golden image" (an image that is based on a correctly manufactured circuit board with target characteristics) to look for differences between the circuit board and a target arrangement of the circuit board represented by the golden image. However, in such examples, the golden image would have to be specifically defined for each circuit board, which can be a time-consuming process, particularly if golden images have to be produced for many different types of circuit boards. Moreover, a golden image may include information for a specific number of sites on the circuit board. Any change of the circuit board occurring in portions of the circuit board away from the sites represented by the golden image may not be detected using techniques based on comparing images of the circuit boards to golden images. Note that anticipated variations (such as markings or date codes added during manufacturing) are not the subject of anomaly detection based on comparisons to golden images.

In accordance with some implementations of the present disclosure, techniques or mechanisms are provided to compare images of a circuit board acquired at different production stages, for the purpose of determining whether a change has been made to the circuit board (e.g., due to tampering, damage, etc.).

FIG. 1 is a block diagram of an example arrangement that includes multiple production stages 102 and 104 to apply different manufacturing processes of a manufacturing flow to a circuit board 106. Although just two production stages 102 and 104 are shown in FIG. 1, it is noted that there can be more than two production stages in other examples.

The production stage 102 includes production equipment 108 to apply a first manufacturing process to the circuit board 106. The production stage 104 includes production equipment 110 to apply a second manufacturing process to the circuit board 106 after the circuit board 106 has been processed by the production stage 102.

Examples of manufacturing processes that can be applied to the circuit board 106 include any or some combination of the following: mounting electronic components onto the circuit board, performing soldering or another electrical connection process to electrically connect electronic components to electrically conductive traces of the circuit board, placing a protective layer onto the circuit board 106, performing quality assurance testing of the circuit board, and so forth.

After the first manufacturing process applied by the production equipment 108, the production equipment 108 outputs the processed circuit board 106 to an input to the next production stage 104. The processed circuit board 106 can be transported (107) from the production stage 102 to the production stage 104. In some cases, this transport can involve handling by a human being. In other cases, the transport may be an automated transport using a robot or a conveyor system. Moreover, the circuit board 106 may be physically stored in a storage facility or may be in transit for a relatively long period of time, which may expose the circuit board to increased opportunities for tampering.

The production equipment 110 in the production stage 104 then applies the second manufacturing process to the circuit board 106. After the manufacturing process applied by the production equipment 110, the production stage 104 can output the further processed circuit board 106 to a next production stage (not shown), if applicable.

In accordance with some implementations of the present disclosure, the production stage 102 includes an imaging system 112 to acquire an image of a surface of the circuit board 106 after the manufacturing process applied by the production equipment 108 in the production stage 102.

In further examples, the imaging system 112 can acquire images of multiple surfaces of the circuit board 106, including an image of a first surface of the circuit board 106 and an image of the circuit board's second surface that is opposite to the first surface. In some examples, as discussed further below in connection with FIG. 2, the imaging system 112 can acquire images of the opposite surfaces of the circuit board 106 concurrently.

The imaging system 112 can store the image of the circuit board 106 as "Image A" in a storage device 114. The storage device 114 can be implemented using a memory device (e.g., a dynamic random access memory (DRAM), a static random access memory (SRAM), a flash memory, etc.), a disk-based storage device, a solid-state storage device, and so forth.

Image A can include an image of one surface of the circuit board 106, or of multiple surfaces of the circuit board 106. Image A acquired at the production stage 102 can be transmitted over a network 116 to a server 118. The network 116 can include a local area network (LAN), a wide area network (WAN), the Internet, a wireless network (e.g., a cellular network, a Wi-Fi network, etc.), and so forth. The server 118 can include a computer or a collection of computers, and can reside in any of various different locations, such as in a cloud, in a data center, or as part of any of the production stages 102, 104, and so forth.

In examples where the server 118 is part of a production stage, the server 118 is considered a "local" server that is able to locally compare images for anomaly detection for a circuit board.

An image of the circuit board 106 can be transmitted by the imaging system 112 over the network 116 (assuming the imaging system 112 includes a network interface, not shown). Alternatively, an image of the circuit board 106 can be transmitted by a different electronic device of the production stage 102 over the network 116 to the server 118.

Image A of the circuit board 106 received from the production stage 102 can be stored in a storage device 120 that is either part of the server 118 or external of but connected to the server 118. Image A is stored in the storage device 120 for subsequent comparison to another image of the circuit board 106 acquired from another production stage, in accordance with some implementations of the present disclosure.

The server 118 further includes an anomaly detection engine 122. As used here, an "engine" can refer to a hardware processing circuit, which can include any or some combination of a microprocessor, a core of a multi-core microprocessor, a microcontroller, a programmable integrated circuit, a programmable gate array, or another hardware processing circuit. Alternatively, an "engine" can refer to a combination of a hardware processing circuit and machine-readable instructions (software and/or firmware) executable on the hardware processing circuit.

The anomaly detection engine 122 manages the storage of the images received from the production stages 102 and 104 in the storage device 120.

The production stage 104 also includes an imaging system 124, which can acquire an image of the circuit board 106 after manufacturing processing by the production stage 102. While the imaging system 112 at the production stage 102 acquires Image A of the circuit board 106 at the output of the production stage 102 (after the manufacturing processing applied by the production equipment 108), the imaging system 124 acquires the image of the circuit board 106 at the input of the production stage 104 (prior to manufacturing processing applied by the production equipment 110).

The image acquired of the circuit board 106 by the imaging system 124 can be of a surface or multiple surfaces of the circuit board 106 received at the input of the production stage 104. The acquired image can be stored as Image B in a storage device 126 of the production stage 104. Image B can be transmitted by the imaging system 124 or another electronic device over a network 128 to the server 118. Although FIG. 1 shows the networks 116 and 128 as being separate networks, it is possible that the networks 116 and 128 can be the same network.

The server 118 includes a network interface 123 (or multiple network interfaces) to communicate over the networks 116 and 128. A network interface can include a transceiver to transmit and receive information, and a protocol stack including protocol layers that manage communication according to respective communication protocols.

The anomaly detection engine 122 compares Image A to Image B for determining whether or not a change has been made to the circuit board 106 during transport (107) between the output of the production stage 102 and the input of the production stage 104. This change may be an unauthorized intentional change or an inadvertent change caused by damage.

Based on the comparison of Image A and Image B, the anomaly detection engine 122 can provide a notification that is sent to a target device, such as a computing device associated with a user, or any other target device. The notification can be in the form of an email, a text message, or another form.

An example of another form is a heat map overlaid on a visual image of the circuit board 106. The heat map can assign different colors or other visual indicators to indicate relative amounts of discrepancies between Image A or Image B (e.g., red indicating high discrepancy, yellow indicating medium discrepancy, and no color indicating low discrepancy).

A user, a program, or a machine can review or analyze the output notification provided by the anomaly detection engine 122, for determining whether or not the identified discrepancies are serious enough for follow-up.

The comparison of Image A and Image B may be a comparison of images of an entire surface(s) of the circuit board 106. In other examples, the comparison of Image A and Image B may be a comparison of images of an portion(s) of a surface(s) of the circuit board 106.

The comparison of Image A and Image B may also take into account regions of the circuit board 106 where differences are expected.

In further examples, Image A or Image B (or both) may be compared to a representation of a target design of the circuit board 106. For example, the representation of the target design of the circuit board 106 can include various information, including information relating to components on the circuit board 106, information identifying where on the circuit board 106 electronic components are populated and which portions of the circuit board 106 are not populated, information identifying labels applied to the circuit board 106, information indicating variations in layout of the circuit board 106, and so forth.

The comparison of Image A or Image B (or both) to the representation of the target design of the circuit board 106 can allow the anomaly detection engine 122 to determine if Image A and/or B represents what was intended to be built.

The representation of a target design of the circuit board 106 can be stored in a database or multiple databases.

Image A or B can also be used by the anomaly detection engine 122 to detect contamination or other quality and/or reliability issues on the circuit board 106.

Figure 2:
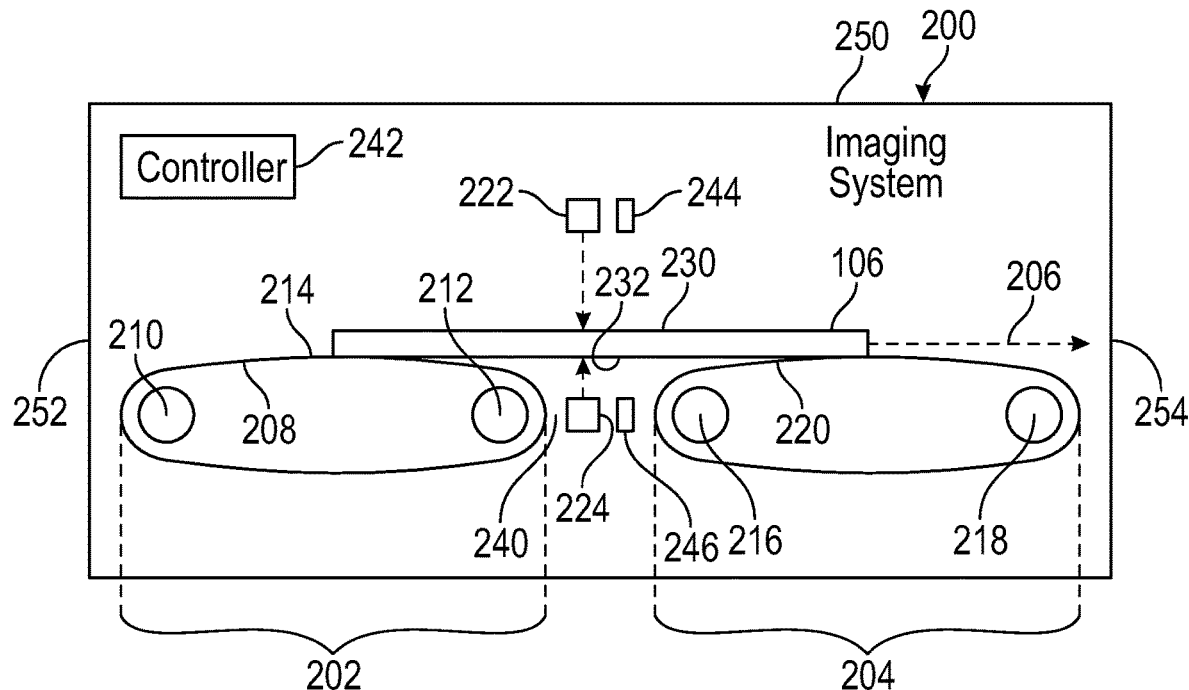
FIG. 2 is a schematic diagram of an imaging system to obtain images of different surfaces of a circuit board, according to some examples.

FIG. 2 is a schematic diagram of an example imaging system 200, which can be the imaging system 112 or 124 of FIG. 1. Although a specific example arrangement is shown in FIG. 2, it is noted that the imaging system 200 can have other example arrangements.

The imaging system 200 can be used with production equipment (e.g., 108 or 110 in FIG. 1). For example, the imaging system 200 can be integrated into or attached to an input or output of the production equipment.

The imaging system 200 includes a first conveyor assembly 202 and a second conveyor assembly 204 for moving the circuit board 106 in a direction indicated by an arrow 206. The conveyor assembly 202 includes a conveyor belt 208 mounted on rollers 210 and 212 of the conveyor assembly 202. Rotation of the rollers 210 and 212 causes rotational movement of the conveyor belt 208 (e.g., clockwise rotational movement) to cause the circuit board 106 mounted on a surface 214 of the conveyor belt 208 to move in the direction 206.

The conveyor assembly 204 includes rollers 216 and 218 for moving a conveyor belt 220, such as in a clockwise direction to move the circuit board 106 in the direction 206. The circuit board 106 can be moved in the direction 206 from the surface 214 of the conveyor belt 208 to a surface 221 of the conveyor belt 220.

In other examples, a mechanism different from the conveyor assemblies 202 and 204 can be employed to move the circuit board 106 along the direction 206 for image acquisition.

In other examples, instead of moving the circuit board 106, the imaging devices can be moved while the circuit board 106 remains stationary. In yet further examples, both the circuit board 106 and the imaging devices are moveable.

The imaging system 200 further includes an upper imaging device 222 that is positioned above the circuit board 106 as the circuit board 106 is moved by the conveyor assemblies 202 and 204 in the direction 206. The imaging system 200 further includes a lower imaging device 224 that is positioned below the circuit board 106 as the circuit board 106 is moved by the conveyor assemblies 202 and 204.

The imaging device 222 can include a camera (or a collection of cameras). The imaging device 224 similarly can include a camera (or a collection of cameras).

The imaging device 222 can acquire an image of a first surface 230 of the circuit board 106. The imaging device 224 can acquire an image of a second surface 232 of the circuit board 106, where the first and second surfaces 230 and 232 are on opposite sides of the circuit board 106.

The arrangement shown in FIG. 2 allows for the imaging system 200 to acquire images of multiple surfaces (230, 232) of the circuit board 106 concurrently. Images of different surfaces of a circuit board are acquired "concurrently" if they are acquired within some specified amount of time of one another, such as within 10 seconds, within 30 seconds, within a minute, and so forth.

In the example arrangement shown in FIG. 2, a gap 240 is provided between the conveyor assemblies 202 and 204 to allow for the lower imaging device 224 below the circuit board 106 to acquire the image of the second surface 232.

The imaging system 200 further includes an upper illumination source 244 and a lower illumination source 246. Each illumination source can include a light source or multiple light sources (e.g., a lamp, a light emitting diode, etc.).

In some examples, multi-spectral images may be acquired either by using broad spectrum illumination sources 244 and 246 and multiple sets of line scan imaging devices 222 and 224 with specific filters to capture specific optical wavelengths. A broad spectrum illumination source outputs light across a full spectrum of expected image capture, allowing a single illumination source to accommodate multiple sensor spectra (e.g., in the ultraviolet light spectrum, visible light spectrum, near infrared light spectrum, infrared light spectrum, etc.). An example of a broad spectrum illumination source is an incandescent light source.

In other examples, multiple different illumination sources for the different optical wavelengths can be used. For example, each illumination source 244 or 246 can include a panel of light sources that illuminate at respective different optical wavelengths.

In some examples, the illumination sources 224 and 246 can be diffuse illumination sources. Although FIG. 2 shows one illumination source 244 or 246 mounted on one side of the respective imaging device 222 or 224, in further examples, illumination sources can be arranged on both sides of each imaging device 222 or 224 to provide more uniform illumination of the respective surface 230 or 232 of the circuit board 106 during imaging acquisition. The illumination sources 244 and 246 are arranged to reduce shadow interference and shade.

In some examples, each imaging device 222 or 224 may include a filter that is replaceable so that multiple filters can be employed for capturing images at respective different optical wavelengths. Alternatively, each imaging device 222 or 224 may include multiple optical sensors provided with respective dedicated filters for capturing images at respective different optical wavelengths.

Alternatively, the imaging devices 222 and 224 can be broad spectrum imaging devices that can capture, in multiple passes of image acquisition, images when illuminated at respective different optical wavelengths by the corresponding illumination sources 244 and 246. In examples where multiple passes are employed for image acquisition, each conveyor belt 202 and 204 is reversible to cause the circuit board 106 to move backwards (in a direction that is opposite of 206).

Use of multiple optical wavelengths can give additional information in identification of tampered or counterfeit products. For example, ultraviolet light may make hand applied flux residue (used as part of soldering) visible, indicating potential hardware tampering. As another example, infrared light may be used to verify genuine product security label features added by a manufacturer during assembly of the circuit board 106.

The imaging system 200 can include a controller 242 that can control activation of the illuminations sources 244, 246 and the imaging devices 222, 224. For example, the controller 242 can be electrically connected or wirelessly connected to the illuminations sources 244, 246 and the imaging devices 222, 224, to send signals, commands, etc., to the illuminations sources 244, 246 and the imaging devices 222, 224 for image acquisition of the circuit board 106.

The controller 242 can also be used to control movement of each conveyor assembly 202 or 204.

In some examples, some components of the imaging system 200 can be contained within an inner chamber defined by an outer housing 250 of the imaging system 200. The outer housing 250 can define openings at ends 252 and 254, through which the circuit board 106 can pass. Ambient light may be blocked from the inner chamber of the imaging system 200 using a curtain, a baffle, or any other mechanism to block light while the circuit board 106 is inside the imaging system 200.

The conveyor assembly 202 is to carry the circuit board 106 through the first end 252 into the imaging system 200, and the conveyor assembly 204 is to move the circuit board 106 through the second end 254 out of the imaging system 200. The gap 240 is small enough to allow the circuit board 106 to move from the conveyor assembly 202 to the conveyor assembly 204 without disruption of the movement.

In further examples, although not shown, a transparent plate may be provided in the gap 240 to support the circuit board 106 as the circuit board 106 is passed between the conveyor assemblies 202 and 204. The transparent plate allows light to pass through to allow the lower imaging device 224 to acquire an image of the surface 232 of the circuit board 106. Additionally, the transparent plate can serve to prevent surface irregularities of the circuit board 106 and/or the conveyor assemblies 202 and 204 from disrupting smooth motion of the circuit board 106.

The housing 250 of the imaging system 200 may be designed for modular application and portability so that the imaging system 200 can be easily integrated with or attached to production equipment of a manufacturing flow.

To detect intentional or unintentional changes made to the circuit board 106 between different production stages, images of the circuit board acquired at the different production stages are compared by the anomaly detection engine 122. An identification technique is provided to enable that the images compared are of the same circuit board 106.

Figure 3:
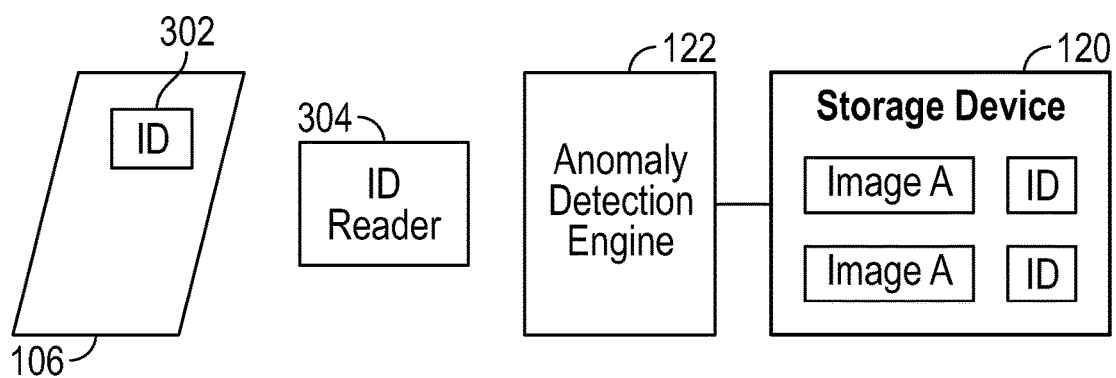
FIG. 3 is a block diagram of an example arrangement including a circuit board with an identifier, an identifier reader, and an anomaly detection engine, according to further examples.

As shown in FIG. 3, the circuit board 106 includes an identifier (ID) 302. The ID 302 may be in any of various different forms, including any or some combination of the following: a serial number of the circuit board 106, a barcode printed on or attached as a label to the circuit board 106, a Radio-Frequency Identification (RFID) tag embedded in or attached to the circuit board 106, or any other type of identifier.

An ID reader 304 can be used to obtain the ID 302. The ID reader 304 can be part of the imaging system 200 or can be separate from the imaging system 200. As an example, the ID reader 304 can include an imaging device (e.g., 222 or 224 in FIG. 2) to capture an image of the ID 302 in examples where the ID 302 is visible. As another example, the ID reader 304 can include a barcode reader to read a barcode on the circuit board 106. As a further example, the ID reader 304 can include an RFID reader to communicate with an RFID tag of the circuit board 106, to acquire the ID 302 of the circuit board 106.

In further examples, the ID 302 may be stored in a storage medium of the circuit board 106. In such examples, the ID reader 304 can access the storage medium over a wired or wireless interface to read the ID 302 stored in the storage medium of the circuit board 106.

The ID read by the ID reader 304 can be stored in conjunction with Image A and Image B in the storage device 120.

In other examples, instead of using an automated technique of acquiring the ID 302 of the circuit board 106, a user can manually enter the ID for association with Image A and Image B in the storage device 120.

By storing the ID 302 in conjunction with each of Image A and Image B, the anomaly detection engine 122 is able to ensure that the images compared are of the same circuit board 106.

For example, the anomaly detection engine 122 stores a first identifier of the circuit board 106 in association with a first image (e.g., image A), where the first identifier is obtained by a first reader (e.g., ID reader 304) at the first production stage. Further, the anomaly detection engine 122 receives a second identifier associated with a second image (e.g., image B), where the second identifier is obtained by a second reader (e.g., ID reader 304) at the second production stage. The anomaly detection engine 122 retrieves the first image to compare to the second image based on the first identifier matching the second identifier.

Figure 4:
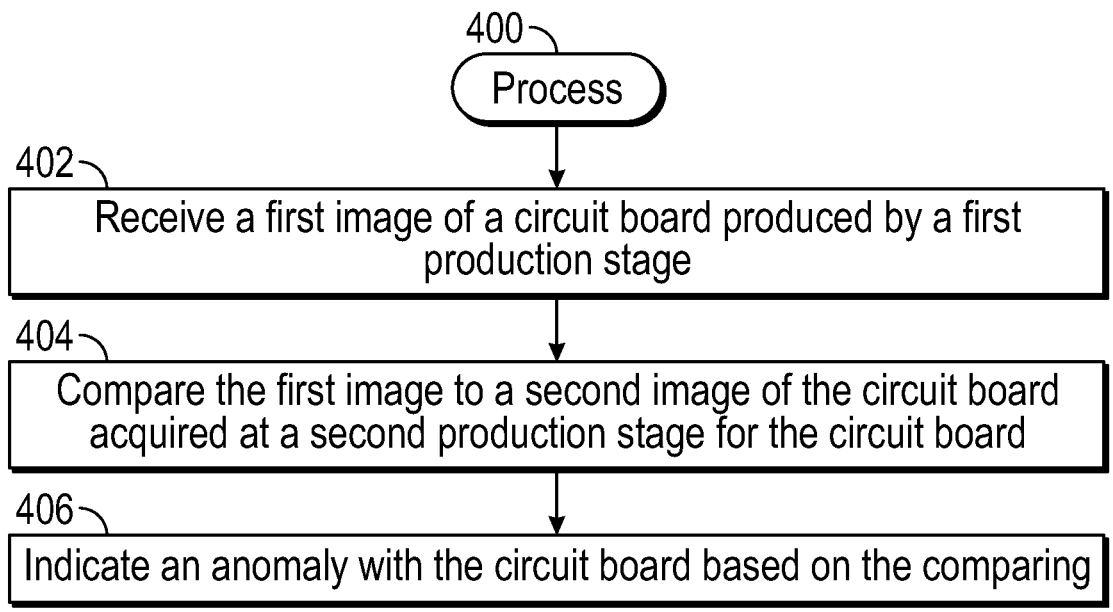
FIG. 4 is a flow diagram of a process according to some examples.

FIG. 4 is a flow diagram of a process 400 according to some implementations of the present disclosure. The process 400 can be performed by a system, such as the server 118 of FIG. 1.

The process 400 includes receiving (at 402) a first image of a circuit board produced by a first production stage (e.g., 102 in FIG. 1).

The process 400 includes comparing (at 404) the first image to a second image of the circuit board acquired at a second production stage for the circuit board. The second image may be acquired at the input to the second production stage, or more generally, at the location where the second production stage is to be performed.

The process 400 includes indicating (at 406) an anomaly with the circuit board based on the comparing. In some examples, the indicating of the anomaly is responsive to the first image not matching the second image. In further examples, the indicating of the anomaly with the circuit board includes generating a visual representation (e.g., the heat map discussed further above) with an indicator representing a portion of the circuit board associated with the anomaly.

In some examples, the first image is a first multi-spectral image of the circuit board, and the second image is a second multi-spectral image of the circuit board.

In some examples, a first image portion of the first image is compared with a second image portion of the second image, where the first image portion and the second image portion represent respective portions of the circuit board expected to remain constant from the first production stage to the second production stage.

In some examples, the first image is of a first surface of the circuit board produced by the first production stage, and the process 400 can further receive a third image of a second surface of the circuit board produced by the first production stage, where the second surface is on an opposite side of the circuit board from the first surface. The process 400 further compares the third image to a fourth image of the circuit board acquired at the second production stage, where the indicating (at 406) is further based on the comparing of the third image to the fourth image.

In some examples, the second image is acquired using a first sensor (e.g., part of the imaging device 222 of FIG. 2) arranged above the circuit board, and the fourth image is acquired using a second sensor (e.g., part of the imaging device 224 of FIG. 2) arranged below the circuit board.

Figure 5:
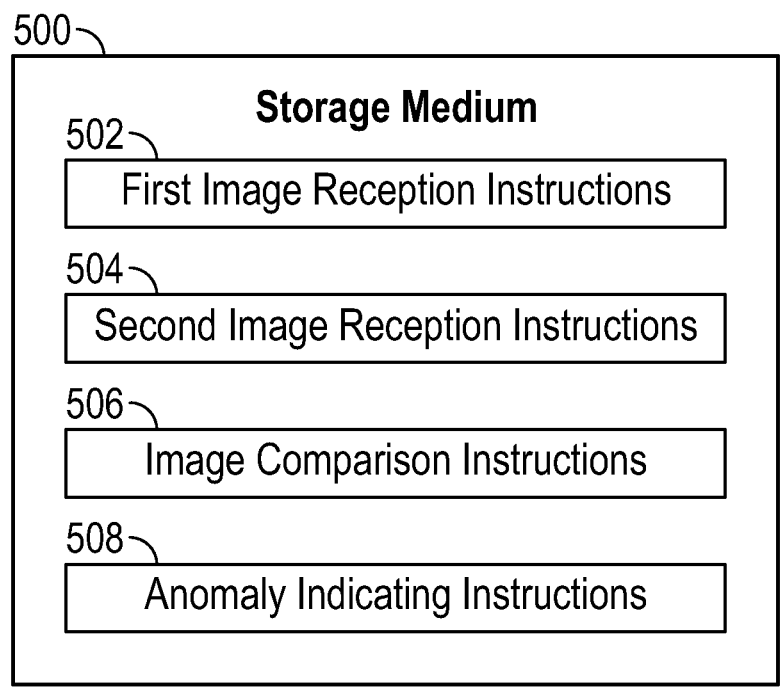
FIG. 5 is a block diagram of a storage medium storing machine-readable instructions according to some examples.

FIG. 5 is a block diagram of a non-transitory machine-readable or computer-readable storage medium 500 storing machine-readable instructions that upon execution cause a system (e.g. the server 118 of FIG. 1) to perform various tasks.

The machine-readable instructions include first image reception instructions 502 to receive a first image of a circuit board produced by a first production stage.

The machine-readable instructions include second image reception instructions 504 to receive a second image of the circuit board acquired at a second production stage for the circuit board, the second image acquired prior to processing of the circuit board by the second production stage and after processing of the circuit board by the first production stage.

The machine-readable instructions include image comparison instructions 506 to compare the first image to the second image.

The machine-readable instructions include anomaly indication instructions 508 to indicate an anomaly with the circuit board based on a mismatch of the first image and the second image identified by the comparing.

Figure 6:
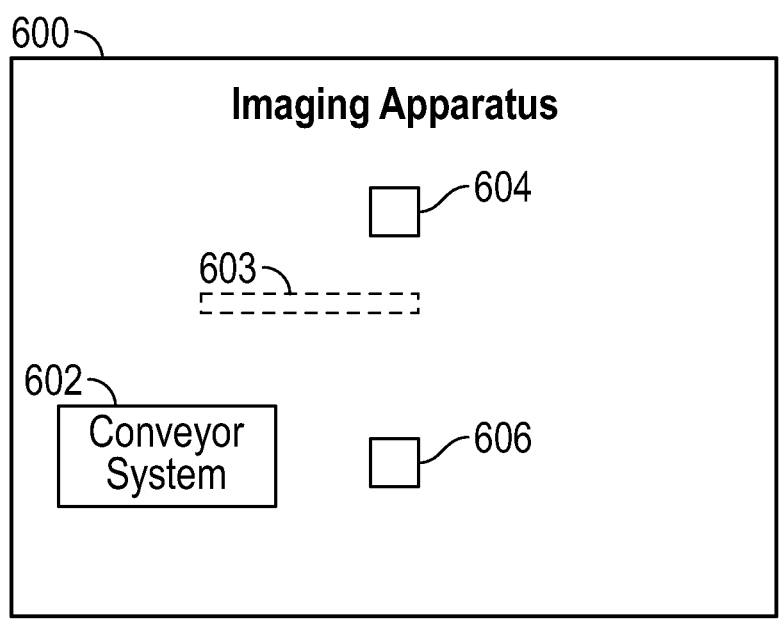
FIG. 6 is a block diagram of an imaging apparatus according to some examples.

FIG. 6 is a block diagram of an imaging apparatus 600, such as the imaging system 200 of FIG. 2 or the imaging system 112 or 124 of FIG. 1.

The imaging apparatus 600 includes a conveyor system 602 to provide relative motion of a circuit board 603 with respect to imaging sensors 604 and 606. In some examples, the conveyor system 602 can include the conveyor assemblies 202 and 204 of FIG. 2, or a different type of transport mechanism. In other examples, the conveyor system 602 can include carriages to which the imaging sensors 604 and 606 are attached, where the carriages are moveable. In further examples, the conveyor system 602 include both conveyor assemblies for moving the circuit board 106, and carriages for moving the imaging sensors 604 and 606. Relative motion of the circuit board 106 and the imaging sensors 604 and 606 can be controlled by a controller, such as the controller 242 of FIG. 2.

The first imaging sensor 604 captures an image of a first surface of the circuit board 603 in an imaging zone between the imaging sensors 604, 606. The second imaging sensor 606 captures an image of a second surface of the circuit board 603 in the imaging zone, where the second surface is on an opposite side of the circuit board 603 from the first surface. The first imaging sensor 604 and the second imaging sensor 606 concurrently acquire the images of the first surface and the second surface.

A storage medium (e.g., 120 in FIG. 1 or 500 in FIG. 5) can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory or other type of non-volatile memory device; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A method comprising:
   receiving, by a system comprising a hardware processor, a first image of a circuit board produced by a first production stage;
   storing, by the system, a first identifier of the circuit board in association with the first image, wherein the first identifier is obtained by a first reader at the first production stage;
   receiving, by the system, a second identifier associated with a second image, wherein the second identifier is obtained by a second reader at a second production stage; and
   retrieving, by the system, the first image to compare to the second image based on the first identifier matching the second identifier;
   comparing, by the system, the first image to the second image of the circuit board acquired at the second production stage for the circuit board; and
   indicating, by the system, an anomaly with the circuit board based on the comparing.

2. The method of claim 1, wherein the indicating of the anomaly is responsive to the first image not matching the second image.

3. The method of claim 1, wherein the first image is a first multi-spectral image of the circuit board, and the second image is a second multi-spectral image of the circuit board.

4. The method of claim 1, wherein each of the first identifier and the second identifier is based on reading a Radio-Frequency Identification (RFID) tag attached to the circuit board.

5. The method of claim 1, comprising:
   acquiring, using a first sensor at a first location of the first production stage, the first image after the circuit board has been produced by the first production stage; and
   acquiring, using a second sensor at a second location of the second production stage, the second image after the circuit board has been transported to the second location from the first location and prior to processing of the circuit board in the second production stage.

6. The method of claim 1, wherein the indicating of the anomaly with the circuit board comprises generating a visual representation with an indicator representing a portion of the circuit board associated with the anomaly.

7. The method of claim 1, wherein the comparing comprises:
comparing a first image portion of the first image with a second image portion of the second image, the first image portion and the second image portion representing respective portions of the circuit board expected to remain constant from the first production stage to the second production stage.

8. The method of claim 1, further comprising:
comparing the first image or the second image to information representing a target design of the circuit board, wherein the indicating of the anomaly is further based on the comparing of the first image or the second image to the information representing the target design of the circuit board.

9. A non-transitory machine-readable storage medium comprising instructions that upon execution cause a system to:
receive a first image of a circuit board produced by a first production stage;
receive a second image of the circuit board acquired at a second production stage for the circuit board, the second image acquired prior to processing of the circuit board by the second production stage and after processing of the circuit board by the first production stage;
store a first identifier of the circuit board in association with the first image,
wherein the first identifier is obtained by a first reader at the first production stage;
receive a second identifier associated with the second image, wherein the second identifier is obtained by a second reader at the second production stage; and
retrieve, the first image to compare to the second image based on the first identifier matching the second identifier;
compare the first image to the second image; and
indicate an anomaly with the circuit board based on a mismatch of the first image and the second image identified by the comparing.

10. The non-transitory machine-readable storage medium of claim 9, wherein the first image is a first multi-spectral image of the circuit board, and the second image is a second multi-spectral image of the circuit board.

11. The non-transitory machine-readable storage medium of claim 9, wherein the instructions that upon execution cause the system to:
identify the circuit board based on an identifier included in a Radio-Frequency Identification (RFID) tag attached on the circuit board.

12. A method comprising:
receiving, by a system comprising a hardware processor, a first image of a circuit board produced by a first production stage;
acquiring, using a first sensor at a first location of the first production stage, the first image after the circuit board has been produced by the first production stage;
acquiring, using a second sensor at a second location of a second production stage, a second image after the circuit board has been transported to the second location from the first location and prior to processing of the circuit board in the second production stage;
comparing, by the system, the first image to the second image of the circuit board acquired at the second production stage for the circuit board; and
indicating, by the system, an anomaly with the circuit board based on the comparing.

13. The method of claim 12, wherein the indicating of the anomaly with the circuit board comprises generating a visual representation with an indicator representing a portion of the circuit board associated with the anomaly.

14. The method of claim 12, wherein the comparing comprises:
comparing a first image portion of the first image with a second image portion of the second image, the first image portion and the second image portion representing respective portions of the circuit board expected to remain constant from the first production stage to the second production stage.

15. The method of claim 12, further comprising:
comparing the first image or the second image to information representing a target design of the circuit board, wherein the indicating of the anomaly is further based on the comparing of the first image or the second image to the information representing the target design of the circuit board.

* * * * *